United States Patent
Hahn

(10) Patent No.: US 7,400,380 B2
(45) Date of Patent: Jul. 15, 2008

(54) TWO-DIMENSIONAL LIGHT-MODULATING NANO/MICRO APERTURE ARRAY AND HIGH-SPEED NANO PATTERN RECORDING SYSTEM UTILIZED WITH THE ARRAY

(75) Inventor: Jae Won Hahn, Seoul (KR)

(73) Assignee: Yonsei University, Seoul (KR)

( * ) Notice: Subject to any disclaimer, the term of this patent is extended or adjusted under 35 U.S.C. 154(b) by 376 days.

(21) Appl. No.: 11/191,038

(22) Filed: Jul. 28, 2005

(65) Prior Publication Data

US 2005/0270514 A1    Dec. 8, 2005

Related U.S. Application Data

(63) Continuation-in-part of application No. PCT/KR03/01387, filed on Jul. 14, 2003.

(30) Foreign Application Priority Data

Jun. 27, 2003    (KR)    ...................... 10-2003-0042649

(51) Int. Cl.
    *G03B 27/42*    (2006.01)
(52) U.S. Cl. .............................. 355/53; 355/67; 355/71; 359/290; 359/618; 359/642; 359/663
(58) Field of Classification Search .................. 355/67, 355/53, 71; 359/290, 618, 619, 642, 663, 359/676
    See application file for complete search history.

(56) References Cited

U.S. PATENT DOCUMENTS

| | | | | |
|---|---|---|---|---|
| 5,307,186 | A | 4/1994 | Izumi et al. | 359/42 |
| 6,195,196 | B1 * | 2/2001 | Kimura et al. | 359/295 |
| 6,281,867 | B2 * | 8/2001 | Kurematsu et al. | 345/88 |
| 6,295,106 | B1 | 9/2001 | Fukuzawa et al. | 349/71 |
| 7,164,523 | B2 * | 1/2007 | Ishii et al. | 359/290 |

FOREIGN PATENT DOCUMENTS

| | | |
|---|---|---|
| JP | 10-254370 A | 9/1998 |
| KR | 10-2003-13133 A | 2/2003 |

* cited by examiner

*Primary Examiner*—Della J. Rutledge
(74) *Attorney, Agent, or Firm*—Bacon & Thomas, PLLC

(57) ABSTRACT

A two-dimensional light-modulating fine aperture array apparatus includes a spatial light-modulating unit for adjusting quantity of incident light by using a plurality of light amount adjusting cells (liquid crystal cells or micromirrors) arrayed in matrix form, a two-dimensional microlens array having microlenses which focus light beams passing through the light quantity adjusting cells, and a highly efficient two-dimensional fine aperture array. The light is emitted through the fine apertures by connecting the two-dimensional light-modulating fine aperture array apparatus with a light source unit. A scanning unit moves in the x and y directions to perform a scanning process on a surface of a recording medium by using the light emitted from the apertures.

21 Claims, 4 Drawing Sheets

Wafer Transfer Stage

US 7,400,380 B2

TWO-DIMENSIONAL LIGHT-MODULATING NANO/MICRO APERTURE ARRAY AND HIGH-SPEED NANO PATTERN RECORDING SYSTEM UTILIZED WITH THE ARRAY

This application is a continuation-in-part application of pending international application number PCT/KR03/01387, filed Jul. 14, 2003, of which the entire disclosure of the pending, prior application is hereby incorporated by reference.

TECHNICAL FIELD

The present invention relates to a lithography technique, and more particularly, to a two-dimensional light-modulating fine aperture array apparatus which uses incident light for recording a fine pattern and a high speed fine pattern recording system capable of forming a fine pattern such as a nano pattern on a semiconductor device at a high recording speed by using the two-dimensional light-modulating fine aperture array apparatus.

BACKGROUND ART

In general, a lithography technique used to manufacture a semiconductor device includes a masking process and an exposure process. That is, the lithography technique includes steps for preparing a photomask on which a pattern is recorded by using a high precision optical system and transferring the pattern on the photomask to a silicon wafer by using the exposure process.

Such lithography technique is an essential technique for obtaining a mask pattern in a semiconductor device manufacturing process. As the integration degree of the semiconductor device becomes higher, the line width of the mask pattern formed on the silicon wafer becomes narrower. The resolution corresponding to the line width implemented with an optical system is represented by the following Equation 1.

$$\text{Resolution} = k_1 \cdot \lambda/(NA) \quad \text{[Equation 1]}$$

In Equation 1, $k_1$ is a lithography process variable, $\lambda$ is a wavelength of a light source, and NA is a numerical aperture of an optical system.

Since the line width of a pattern becomes narrower as the resolution of the optical system is higher, many approaches for improving the resolution have been developed. As shown in Equation 1, the resolution can be improved by reducing the process variable $k_1$, increasing the numerical aperture NA, or using a short-wavelength light source.

In the current lithography technique used in a semiconductor device manufacturing process, the process variable $k_1$ can be reduced down to 0.4~0.3, and the numerical aperture NA of about 0.8 can be obtained by an optical system. Under these conditions, when a krypton fluoride (KrF) excimer laser having a wavelength of 248 nm is used as a light source, the resolution determining the line width in the lithography is in a range of 90 to 120 nm.

When an argon fluoride (AgF) laser having a wavelength of 193 nm would be used as a light source, the resolution determining the line width in the lithography will be improved to a range of 70 to 100 nm.

However, in order to improve the resolution by using the ultraviolet light source having a shorter wavelength, a highly-qualified fused silica used as an optical member of a conventional high precision optical system must be replaced with calcium fluoride (CaF) and a photoresist sensitive to the ultraviolet light must be used. In addition, if an exposure process is performed by using a mask pattern, light is refracted at an aperture, so that the result of the exposure process may be deteriorated.

When light passes through a hole having a diameter of several nanometers which is relatively small in compare with the wavelength of the light, the intensity of light transmitting the hole is proportional to the fourth power of the diameter of hole. Therefore, as the diameter of the aperture is reduced, the intensity of light is rapidly decreased in inverse proportion to the fourth power of the diameter of aperture. Therefore, when the diameter of the aperture through which the light source passes is reduced to form a nano pattern (hereinafter, sometimes referred to as "fine pattern"), the intensity of the light is reduced, so that the time period for the exposure process and the scanning process to form the nano pattern are lengthened.

In consideration of the developing speed in the integration degree of semiconductor devices, the resolution of the lithography technique is expected to reach about 55 nm in a few years. Lithography techniques using an ultraviolet light or electron beams are actively researched and developed, but these techniques still remains at a laboratory level. For the last decade, the lithography technique has imposed limitation on the integration degree of semiconductor devices. Therefore, a novel fine patterning technique is urgently demanded.

An object of the present invention is, therefore, to overcome a technical limitation on the resolution by providing a novel fine patterning technique of directly recording a fine pattern on a photoresist without using a photomask.

Another object of the present invention is to provide an apparatus using a laser source suitable for a sensitive wavelength of conventional photoresists.

In order to achieve the aforementioned objects, a two-dimensional light-modulating fine aperture array apparatus utilizes two well-known approaches for transmitting a large amount of light through apertures having a size of tens of nanometers. The first approach is disclosed in an article by X. Shi and L. Hesselink, titled "Mechanism for enhancing power throughput from planar nano-apertures for near-field optical data storage" in Japan Journal of Applied Physics Vol. 41, pp. 1632-1635 (2002). According to the first approach, the transmittance can be greatly improved by using a metal optical waveguide aperture.

The second approach is disclosed in an article by Y. J. Kim, K. S. Suzuki, and K. Goto, titled "Parallel recording array head of nano-aperture flat-tip probes for high-density near-field optical data storage" in Japan Journal of Applied Physics. Vol. 40, pp 1783-1789 (2001) and another article by K. Goto, Y. J. Kim, S. Mitsugi, K. Suzuki, K. Kurihara and T. Horibe, titled "Micro-optical two-dimensional devices for the optical memory head of an ultrahigh data transfer rate and density system using a vertical cavity surface emitting laser array" in Japan Journal of Applied Physics. Vol. 41, pp. 4835-4840 (2002). According to the second approach, focal point size of a light can be greatly reduced by coupling a lens having a large numerical aperture NA with a medium having a high index of refraction.

DETAILED DESCRIPTION OF THE INVENTION

In accordance with a first aspect of the present invention, there is provided a two-dimensional light-modulating fine aperture array apparatus comprising: a spatial light-modulating unit for adjusting an amount of incident light by using a plurality of light amount adjusting cells arrayed in matrix form; a microlens array having microlenses arrayed in matrix form, the microlenses focusing light beams passing through the light amount adjusting cells; a substrate for transmitting the light beams, the substrate attached under the microlens array, the substrate having a thickness equal to a focal length of the microlens; and an aperture array having apertures arrayed in matrix form on a thin metal film coating the substrate, the apertures transmitting the light beams focused by the microlenses.

In accordance with a second aspect of the present invention, there is provided a two-dimensional light-modulating fine aperture array apparatus comprising: a spatial light-modulating unit for adjusting an amount of incident light by using a plurality of light amount adjusting cells arrayed in matrix form; a microlens array having microlenses arrayed in matrix form, the microlenses focusing light beams passing through the light amount adjusting cells, a focal point of each of the microlenses is located on a surface of each of the microlenses; and an aperture array having apertures at the focal points of the microlenses on the thin metal film, the thin metal film coating the surfaces of the microlens.

In accordance with a third aspect of the present invention, there is provided a high speed fine pattern recording system comprising: one of the two-dimensional light-modulating fine aperture array apparatuses of the first and second aspects of the present invention; a light source unit for emitting a laser beam; an optical transmitting member for transmitting the laser beam; a collimated-light generating lens for collimating the laser beam transmitted from the optical transmitting member; and a scanning unit connected to the two-dimensional light-modulating fine aperture array apparatus, the scanning unit for forming a predetermined pattern by moving the two-dimensional light-modulating fine aperture array apparatus in x and y directions to perform a light illumination process with the apertures of the microlens array.

Preferably, the spatial light-modulating unit may be a liquid crystal optical modulator having liquid crystal cells arrayed in matrix form, wherein the liquid crystal optical modulator adjusts the light amount of incident light by controlling alignment of liquid crystal molecules in the liquid crystal cells with a voltage.

In addition, preferably, the spatial light-modulating unit may be a digital micromirror device (DMD) having micromirrors arrayed in matrix form, wherein the digital micromirror device adjusts the light amount of incident light by controlling slant angles of the micromirrors.

In addition, preferably, the light-modulating unit may be implemented with various types of photon/electron optical devices used for a two-dimensional spatial light-modulating.

In addition, preferably, the substrate may be a glass or GaP substrate.

In addition, preferably, the high speed fine pattern recording may further comprise: two CCD units disposed at both side portion over the two-dimensional light-modulating fine aperture array apparatus, the CCD units for converting light reflected on the apertures in the two-dimensional light-modulating fine aperture array apparatus into electrical signals; a polarized light divider for separating a predetermined polarized light from light incident to the two-dimensional light-modulating fine aperture array apparatus to provide the separated polarized light to the one CCD; and a wave plate for preventing a change of a polarized light passed through the two-dimensional light-modulating fine aperture array apparatus and reflected thereon to provide the polarized light to the other CCD.

Now, a two-dimensional light-modulating fine aperture array apparatus and a high speed fine pattern recording system according to the present invention will be described with reference to the accompanying drawings.

FIG. 1 is a schematic cross sectional view of a two-dimensional light-modulating fine aperture array apparatus according to a first embodiment of the present invention. FIG. 2 is a plan view of a liquid crystal light-modulating unit according to an embodiment of the present invention.

As shown in FIG. 1, the two-dimensional light-modulating fine aperture array apparatus 10 according to the first embodiment of the present invention comprises a liquid crystal light-modulating unit 11, a microlens array 12, a metal optical waveguide aperture array 13, a distance adjusting unit 14, and a substrate 15.

The liquid crystal light-modulating unit 11 has a function of adjusting an amount of incident light by using a plurality of liquid crystal cells. As shown in FIG. 2, the (m1×m2) liquid crystal cells are disposed in a two-dimensional array, where m1 and m2 are the numbers of liquid crystal cells in the x and y directions, respectively.

The liquid crystal light-modulating unit 11 is designed to apply different electric fields to different liquid crystal cells, respectively. In accordance with the electric field applied to a liquid crystal cell, the alignment of liquid crystal thereof is changed, so that the transmittance of the incident light can be adjusted. Since the transmittance of the incident light can be adjusted, the liquid crystal light-modulating unit 11 is called a "light valve."

The liquid crystal light-modulating unit 11 may adjust the alignment of liquid crystal by setting first and second voltages for 0% and 100% transmittances of light, respectively. Moreover, the liquid crystal light-modulating unit 11 may adjust the alignment of liquid crystal in multiple directions by setting three or more voltages for multiple levels of transmittances of light between 0% to 100% transmittances. Preferably, the liquid crystal cells are disposed in a matrix form.

The microlens array 12 comprises a plurality of microlenses disposed in a two-dimensional array. In order to focus light passing through the liquid crystal light-modulating unit 11, the microlens array 12 is disposed under the liquid crystal light-modulating unit 11. More specifically, the microlenses of the microlens array 12 are disposed to correspond to the liquid crystal cells of the liquid crystal light-modulating unit 11. Each of the liquid crystal cells has an optical axis aligned with that of the corresponding microlens.

The maximum number of microlenses in the microlens array 12 may not exceed the number of liquid crystal cells in the liquid crystal light-modulating unit 11. The detailed shape of the array of the microlenses is determined based on the shape of the array of the liquid crystal cells in the liquid crystal light-modulating unit 11. That is, when the array of the liquid crystal cells is in matrix form, the array of the microlenses is also in matrix form.

The substrate 15 is attached at the lower surface of the microlens array 12, and the thickness of the substrate 15 is substantially equal to the focal distance of the microlens. Preferably, the substrate 15 is made of a transparent material, e.g., glass and GaP, having a predetermined index of refraction.

The metal optical waveguide aperture array 13 is formed by coating a thin metal film on a surface of the substrate 15 on which the light is focused by the microlenses. The metal optical waveguide aperture array 13 provides a plurality of apertures, that is, metal optical waveguide apertures, in a two-dimensional array on the thin metal film. Each of the apertures has an optical axis which is aligned with the optical axis of the corresponding microlens, thereby transmitting the light focused by the microlens. The number of the apertures in the metal optical waveguide aperture array 13 may not exceed the number of the microlenses. The detailed shape of the array of the apertures 13 is determined based on the shape of the array of the microlenses 12. That is, when the array of the microlenses is in a shape of matrix, the array of the apertures is also in a shape of matrix.

The aforementioned first article shows that, in a case where a substrate 15 having a predetermined index of refraction and metal optical waveguide apertures are used, the transmittance can be improved and a light source having a power greater than the intensity of the focused light beams can be obtained.

Here, in order to increase the recoding speed, it is preferable that a large number of apertures be provided to the aperture array. Accordingly, it is preferable that the diameter of microlens be small.

The distance adjusting unit 14 has a function of adjusting the distance between the liquid crystal light-modulating unit 11 and the microlens array 12. The distance adjusting unit 14 is a portion of the housing which fixes the liquid crystal light-modulating unit 11, the microlens array 12, and the metal optical waveguide aperture array 13.

Up to now, a liquid crystal cell having a fine size of 10 μm is available for a beam projector in a liquid crystal light-modulating unit. Therefore, a liquid crystal light-modulating unit 11 can be provided with 1,000,000 or more liquid crystal cells having a size of 10 μm, of which the number is 1,000 or more in each of the x and y directions. In this case, since the area of a single liquid crystal cell is 10 μm×10 μm, the entire area of liquid crystal cell array is 10 cm×10 cm.

Currently, a microlens having a diameter of 10 μm used for the microlens array 12 can also be obtained. Therefore, the aperture can be formed to have a size of a few nanometers, which is also the size of focused light flux, so that a nano pattern can be recorded with the metal optical waveguide aperture array 13.

If the size of the liquid crystal cell and the diameter of the microlens are determined as 10 μm, the pitch between the adjacent apertures becomes 10 μm. This is because the light focused by the microlens is located at the center of the microlens.

The metal optical waveguide aperture array 13 is designed in a form of a two-dimensional array on the substrate and coupled with the two-dimensional light-modulating fine aperture array apparatus 10 to focus the laser beams on the respective apertures. As a result, the size of light flux represented by the following Equation 2 is obtained.

(Size of light flux)=0.51 $\lambda_0/(nNA)$ [Equation 2]

In Equation 2, $\lambda_0$ is a wavelength of a light source and n is an index of refraction of a medium.

In order to achieve the objects of the present invention, it is preferable that a wavelength of light incident to the liquid crystal light-modulating unit 11 be short, the microlenses have a large numerical aperture NA greater than 1, and the substrate have a high index of refraction, in accordance with the optical condition of Equation 2.

Here, if the substrate has a high index of refraction greater than 1.5, the microlenses may have a large numerical aperture NA, e.g., a numerical appature greater than 1. In addition, if a blue laser having a wavelength of about 400 nm is used as a light source, the size, that is, diameter of the light flux focused on the aperture can be reduced down to 100 nm or less. Furthermore, if an argon ion laser having a wavelength of 488 nm and a GaP substrate having a index of refraction of about 3.5 are used, the diameter of the light flux can be reduced down to 70 nm.

FIG. 3 is a schematic cross sectional view of a two-dimensional light-modulating fine aperture array apparatus according to a second embodiment of the present invention. As shown in FIG. 3, the two-dimensional light-modulating fine aperture array apparatus 20 according to the second embodiment of the present invention comprises a liquid crystal light-modulating unit 21, a microlens array 22, an optical waveguide head array 23, and a housing 24.

The liquid crystal light-modulating unit 21 has a same configuration as those of the liquid crystal light-modulating unit 11 of the first embodiment.

The microlenses in the microlens array 22 having a shape of cone with a large numerical aperture NA are arrayed in matrix form. In this case, the microlenses are made from the substrate 15 of the first embodiment in such a manner that the focal points of the microlenses are located on the vertices of the cones.

The optical waveguide head array 23 is obtained by coating a thin metal film on a lower surface of the microlens array 22 and forming a plurality of apertures on the thin metal film. The light incident to the microlens is refracted due to the curvature of the microlens and guided by the thin metal film, so that the light is focused on the vertex of cone. Therefore, the apertures are designed to be disposed at the vertexes of cones where the intensity of the light is strongest.

The housing 24 is used to fix the components 21 to 23 together.

The cells, microlenses, and apertures of the second embodiment are disposed to have a same optical axis as in the first embodiment.

According to the second embodiment of the present invention, since the microlenses having a large numerical aperture NA and the substrate having a high index of refraction are combined, it is possible to greatly reduce the size of a light flux at a focal point as can be explained by Equation 2.

BRIEF DESCRIPTION OF THE DRAWINGS

The above and other objects, advantages and features of the present invention will become apparent from the following description of preferred embodiments given in conjunction with the accompanying drawings, in which.

BEST MODE FOR CARRYING OUT THE INVENTION

Figure 1:
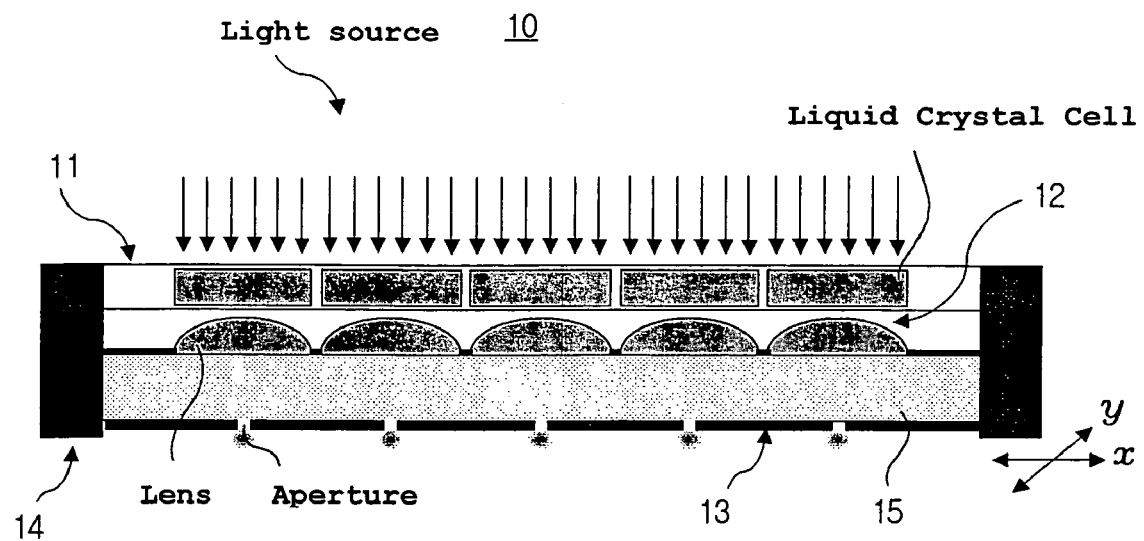
FIG. 1 is a schematic cross sectional view of a two-dimensional light-modulating fine aperture array apparatus according to a first embodiment of the present invention.
Figure 2:
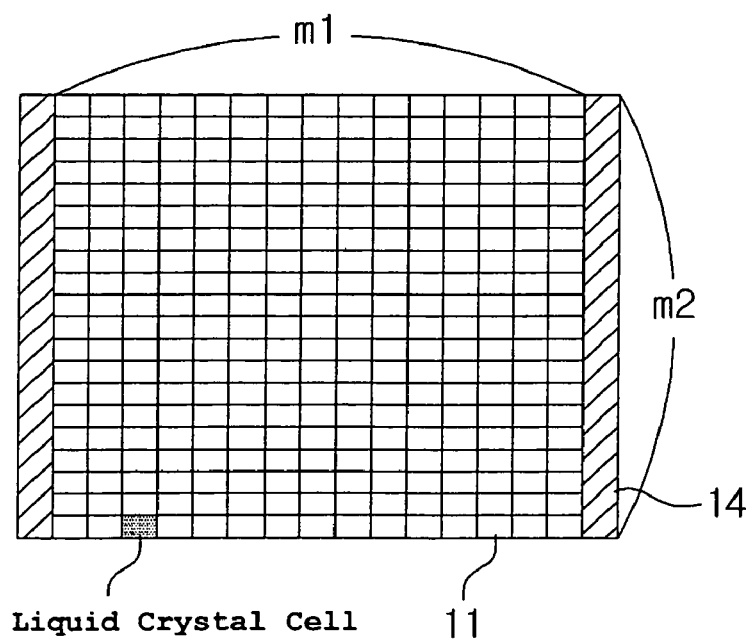
FIG. 2 is a plan view of a liquid crystal light-modulating unit according to an embodiment of the present invention.
Figure 3:
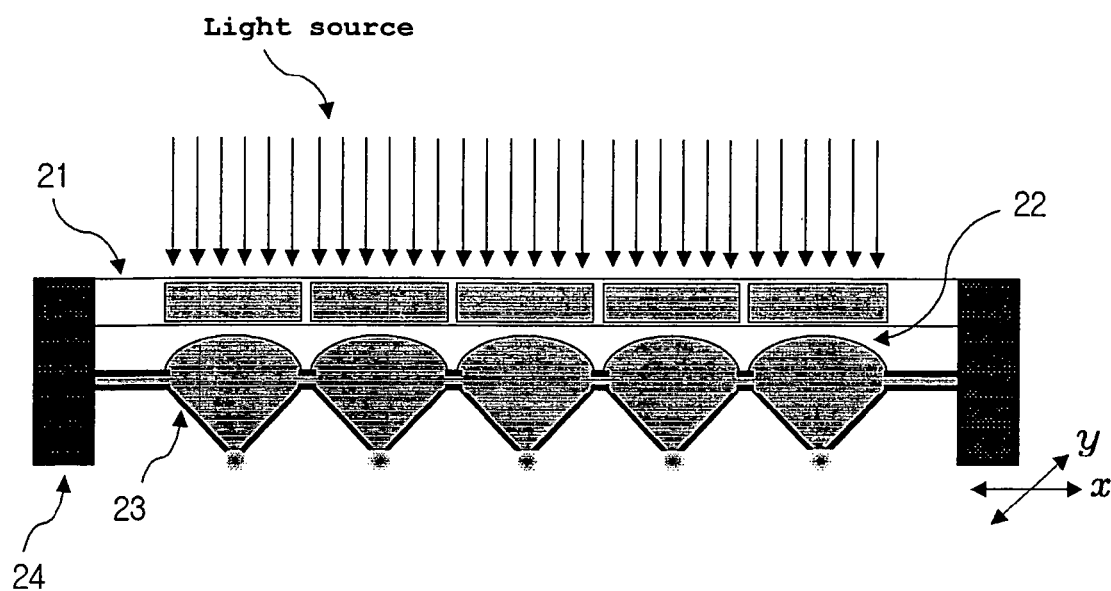
FIG. 3 is a schematic cross sectional view of a two-dimensional light-modulating fine aperture array apparatus according to a second embodiment of the present invention.
Figure 4:
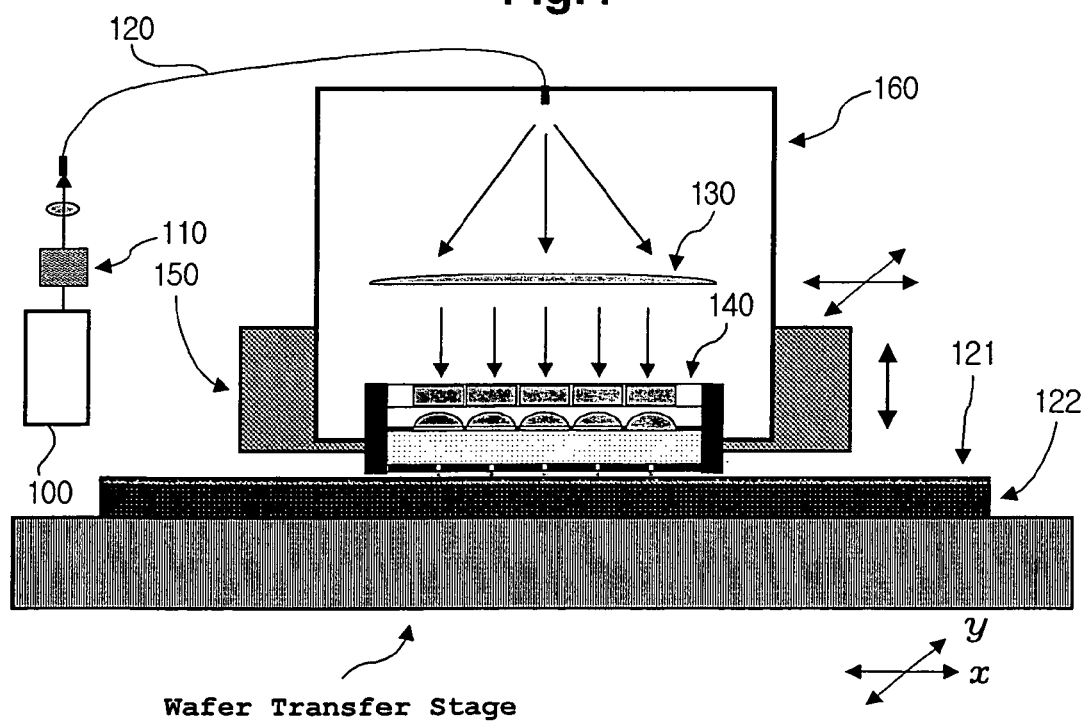
FIG. 4 is a schematic front view of a high speed fine pattern recoding system using the two-dimensional light-modulating fine aperture array apparatus according to the first embodiment of the present invention.

FIG. 4 is a schematic front view of a high speed fine pattern recoding system using the two-dimensional light-modulating fine aperture array apparatus according to the first embodiment of the present invention. As shown in FIG. 4, the high speed fine pattern recoding system comprises a light source unit 100, an output stabilizing unit 110, an optical transmitting member 120, a collimated-light generating lens 130, a two-dimensional light-modulating fine aperture array apparatus 140, a scanning unit 150, and a housing 160.

The light source unit 100 generate laser light beams for the two-dimensional light-modulating fine aperture array apparatus 140. The light source includes any type of continuous oscillating lasers having a power of 100 mW or more such as a 488 nm argon ion laser, a 442 nm helium cadmium laser, a 405 nm diode laser and a 355 nm YAG laser which use a third harmonic and a 266 nm YAG laser which uses a fourth harmonic. The type of laser is selected based on the transmittance of a substrate constituting a fine aperture array apparatus, the spectroscopic sensitivity of a photoresist, the diameter of a microlens, and so on.

The output stabilizing unit 110 equalizes the intensity of the light emitted from the light source unit 100. The optical transmitting member 120 transmits the equalized light from the output stabilizing unit 110 to a target position. The light passing through the optical transmitting member 120 is a spatial filtered light. The optical transmitting member 120 shown in FIG. 4 is an optical fiber for transmitting light.

The collimated-light generating lens 130 is disposed over the two-dimensional light-modulating fine aperture array apparatus 140 to collimate the light transmitted from the optical transmitting member 120 and distribute the collimated light over a wide area. The collimated light is distributed at least over the entire area of the two-dimensional light-modulating fine aperture array apparatus 140. Preferably, the collimated-light generating lens 130 is a beam homogenizer in order to uniformly distribute the light.

The two-dimensional light-modulating fine aperture array apparatus 140 may be one of the aforementioned two-dimensional light-modulating fine aperture array apparatuses 10 and 20 according to the first and second embodiments of the present invention. In FIG. 4, the two-dimensional light-modulating fine aperture array apparatus 140 is the two-dimensional light-modulating fine aperture array apparatus 10 according to the first embodiment of the present invention. The two-dimensional light-modulating fine aperture array apparatus 140 is connected to a computer, which is connected to a voltage applying unit capable of applying different voltages to respective liquid crystal cells and the voltages applied to the liquid crystal cells are controlled thereby. The optical transmittance of each liquid crystal cell is determined based on the corresponding voltage applied to the liquid crystal cell.

The scanning unit 150 moves the two-dimensional light-modulating fine aperture array apparatus 140 in the x and y directions. Due to the movement of the scanning unit 150, the two-dimensional light-modulating fine aperture array apparatus 140 can form a nano pattern on the photoresist disposed under the same by using the light emitted from the apertures. It is preferable that the scanning unit 150 be a high precision stage having a resolution of an order of nanometer.

When the scanning unit 150 moves the two-dimensional light-modulating fine aperture array apparatus 140 in the x or y direction, adjacent patterns generated by the adjacent aperture must not be overlapped. The scanning unit 150, therefore, should have a resolution of an order of nanometer.

The scanning unit 150 may also move in the z direction as well as in the x and y directions. When the scanning unit 150 moves in the z direction, the distance between the two-dimensional light-modulating fine aperture array apparatus 140 and the photoresist may decrease or increase.

As a commercial example of the scanning unit 150 used in the present invention, there is a PZT NanoAutomation Stages Model P-752 provided by Physik Instrumente Co. The instrument can perform the scanning process with a scanning speed of 5 μm per 17 ms under a load of 300 g.

The scanning unit 150 has a stage adjusting unit (not shown) interfaced with a computer (not shown), so that the scanning unit 150 can move in the x and y directions in accordance with the pattern information input from the computer.

The housing 160 is connected to optical output nozzles of the optical transmitting member 120. The housing 160 has a function of fixing the collimated-light generating lens 130 and the two-dimensional light-modulating fine aperture array apparatus 140. In addition, the housing 160 is connected to the scanning unit 150, so that the two-dimensional light-modulating fine aperture array apparatus 140 can be interlocked with the movement of the scanning unit 150.

Figure 5:
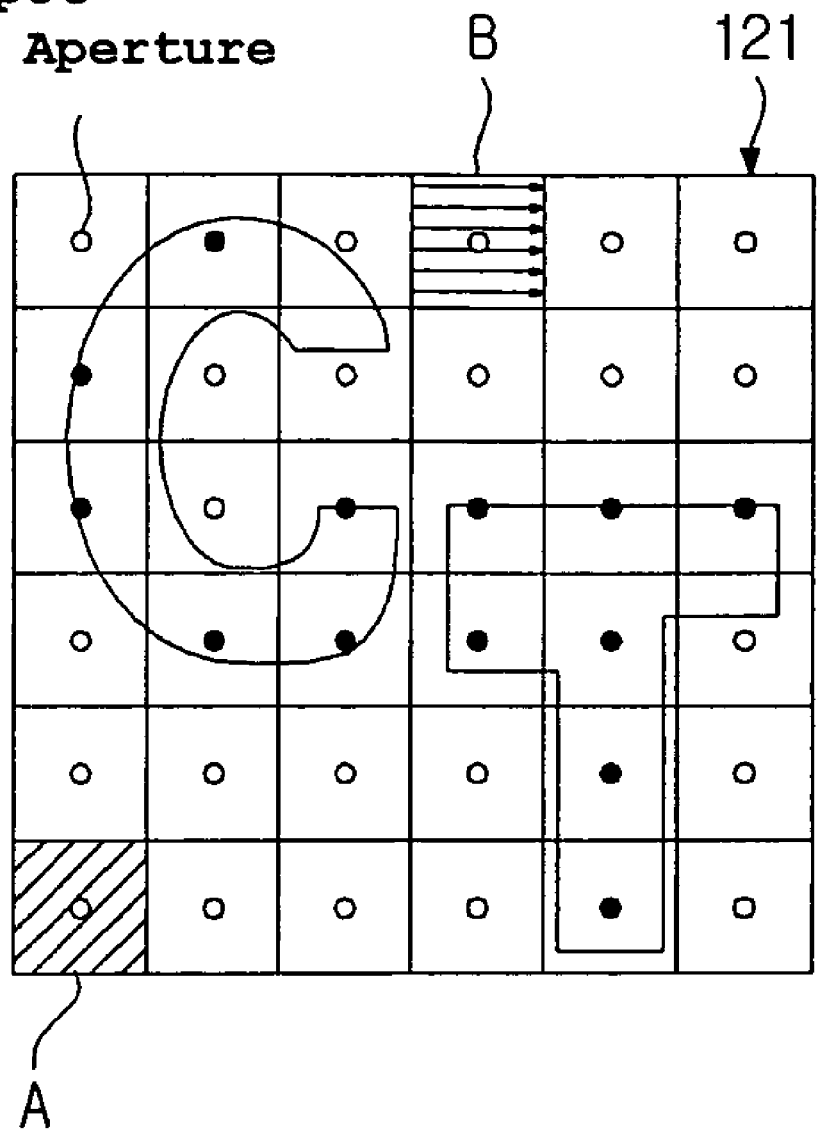
FIG. 5 is a diagram showing a surface of a photoresist on which a fine pattern is recorded according to an embodiment of the present invention.

Now, operations of the high speed fine pattern recoding system using the two-dimensional light-modulating fine aperture array apparatus according to the first embodiment of the present invention will be described with reference to FIG. 5. FIG. 5 is a diagram showing a surface of a photoresist on which a fine pattern is recorded according to the present invention.

At first, a user inputs information regarding a pattern shown in FIG. 5, which is to be formed on a photoresist 121 coated on a silicon wafer 122, into a computer. The computer matches the pattern information with coordinates and determines whether or not there is a pattern at each coordinate. The position information (coordinate information) of each aperture of the two-dimensional light-modulating fine aperture array apparatus is provided to the computer in advance. With the above information, the computer determines each aperture whether to block or emit light. That is, if the computer determines that the aperture corresponds to a coordinate where the pattern exists, the aperture emits the light. If not, the aperture does not emit, that is, blocks the light.

In order to obtain a uniform contrast for the recorded pattern, the intensities of the laser beams emitted from the aperture array are equalized. For this reason, the transmittance of cells of the two-dimensional spatial modulation unit is suitably adjusted based on the intensity distribution of incident laser beams and data on corrected transmittance of apertures.

The computer sets voltages applied to liquid crystal cells corresponding to apertures for blocking light as first voltage and voltages applied to liquid crystal cells corresponding to apertures for emitting light as second voltages. At the time of the system operation, the voltages are applied to the corresponding liquid crystal cells of the liquid crystal light-modulating unit 11. If the first voltage is applied, liquid crystal molecules in the corresponding liquid crystal cell are aligned in a direction across the axis of light. If second voltage is applied, the liquid crystal molecules in the corresponding liquid crystal cell are aligned in the axis of the light.

When light is emitted from a laser source of a light source unit 100, the emitted light passes through the output stabilizing unit 110 and the optical transmitting member 120 to illuminate the interior of the housing 160. The illuminated light is collimated by the collimated-light generating lens 130. The collimated light is uniformly incident to the liquid crystal modulation unit of the two-dimensional light-modulating fine aperture array apparatus 140.

The collimated light is incident to a plurality of liquid crystal cells. Only the collimated light which is incident to the liquid crystal cell that passes light, that is, the liquid crystal cell applied with the second voltage under the control of the computer, is focused on the corresponding microlens in the microlen array. The light focused by the microlens illuminate the photoresist thereunder through the corresponding aperture.

FIG. 5 shows light spots, that is, positions on the photoresist 121 which are illuminated with the focused light through the apertures. In FIG. 5, the letters of CT indicates a final pattern obtained from the light spots on the photoresist 121. Each region partitioned with dotted lines is scanned with a single light spot passing through a single aperture. In addition, each of the partitioned regions is marked with the symbol of a white or block dot. The black dot indicates a light spot blocked by a liquid crystal cell, with which the photoresist 121 is not illuminated. The white dot indicates a light spot passing through a liquid crystal cell, with which the photoresist 121 is illuminated.

As a result, as shown in FIG. 5, light spots outside the pattern are blocked by the liquid crystal cells so that the light spot indicated with the black dots. On the other hand, light spots inside the pattern pass through the liquid crystal cells and are indicated with the white dots.

Like this, under the condition that only the apertures corresponding to the inside of the pattern pass the light, the scanning unit 150 moves the two-dimensional light-modulating fine aperture array apparatus without departing from a single partitioned region in the x and y directions. In other words, the single partitioned region is scanned with a single aperture.

For detailed description of the scanning process shown in B, it is assumed that the size of one cell of a nano device, that is, the size of the region A, is 10 μm×10 mμ and the diameter of a microlens is 50 nm. In this case, the x-directional scanning width is 10 μm. The entire area of the cell is scanned by performing 200 times of the x-directional scanning operations in the y direction.

During the scanning operation, when the light spot enters and leaves the pattern, the voltage applied to the corresponding liquid crystal cell is changed, so that the light spot is changed into the black or white dot.

As a result, in accordance with the operation of the scanning unit 150 and the change of the voltage applied to the liquid crystal cell, a target pattern can be formed on the photoresist.

It can be understood that the pattern forming operation according to the present invention is similar to an operation of printing an image with an inject printer.

Since the light emitted from the aperture array diverges rapidly, it is preferable that the distance between the surface of photoresist and the apertures be narrow as about 20 nm. In consideration of the narrow distance between the surface of photoresist and the apertures, it is preferable that a distance adjusting unit be fixed to the two-dimensional light-modulating fine aperture array apparatus 140 or the scanning unit 150.

Figure 6:
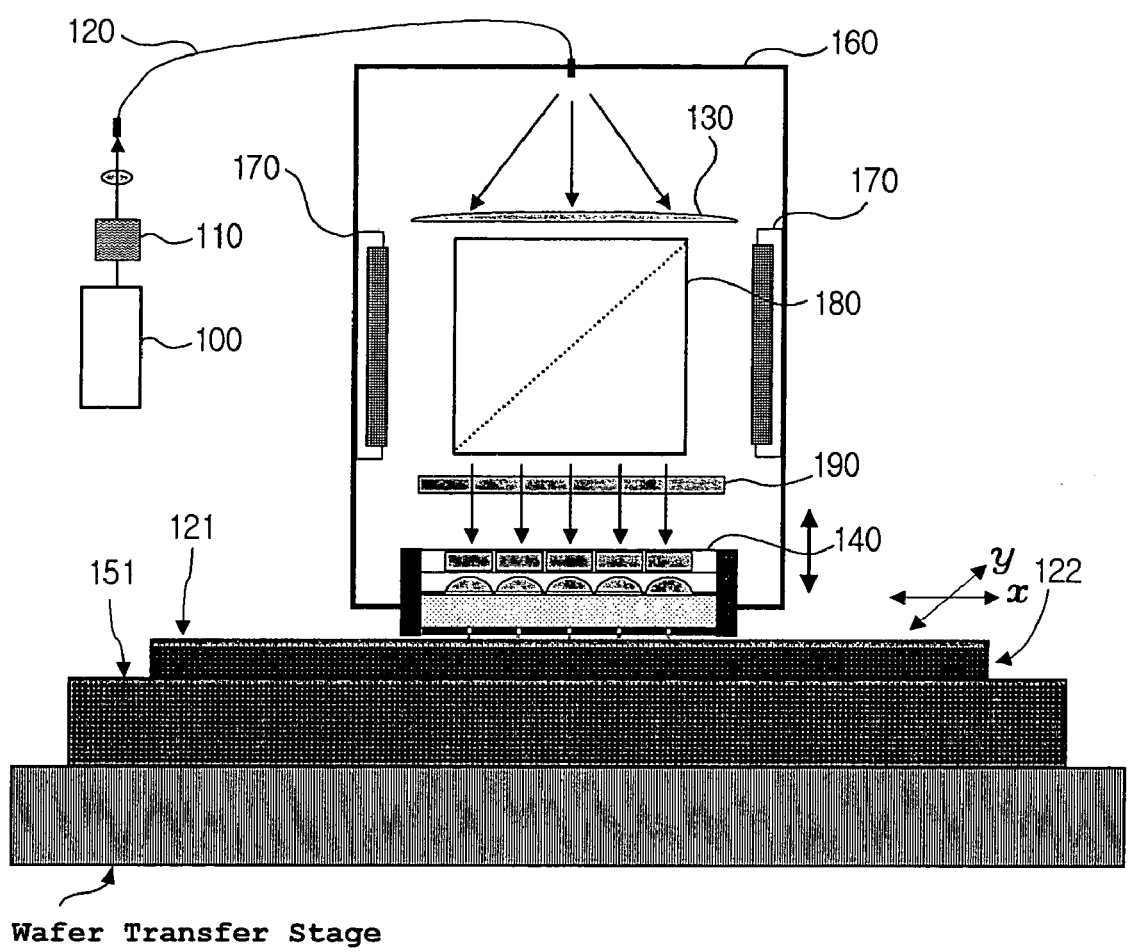
FIG. 6 is a schematic front view of a high speed fine pattern recoding system using the two-dimensional light-modulating fine aperture array apparatus according to the second embodiment of the present invention.

FIG. 6 is a structural view of a high speed fine pattern recoding system using the two-dimensional light-modulating fine aperture array apparatus according to the second embodiment of the present invention.

As shown in FIG. 6, the high speed fine pattern recoding system according to the second embodiment of the present invention comprises a light source unit 100, an output stabilizing unit 110, an optical transmitting member 120, a collimated-light generating lens 130, a two-dimensional light-modulating fine aperture array apparatus 140, a scanning unit 151, a housing 160, CCD units 170, a polarized light divider 180, and a ¼ wave plate 190.

The high speed fine pattern recoding system according to the second embodiment is substantially the same as that of the first embodiment. The difference is that there are means for detecting intensity of light passing through the aperture to compensate contrast of the light and means for adjusting fine movement for scanning process.

The means for detecting intensity of light includes the CCD units 170 for converting an incident light into an electrical signal, the polarized light divider 180 for separating a predetermined polarized light and the ¼ wave plate 190 for preventing changes of polarized light reflected on a thin metal film and a photoresist 121.

A first CCD unit 170 detects a polarized light, which is separated by the polarized light divider 180 and reflected on a reflection plate thereon indicated by a dotted line in the figure, and converted the polarized light into an electrical signal. A second CCD unit 170 detects a polarized light, which was passed through the ¼ wave plate 190 and reflected on the thin metal film or the photoresist 121 and passed through the ¼ wave plate 190 again and reflected on the reflection plate of the polarized light divider 180, and converts the polarized light into an electrical signal. The electrical signals converted from the polarized lights are input to the computer (not shown). The computer obtains information on the light incident on the photoresist 121 by calculating a mean value of output signals of the CCD units 170.

Unlike the scanning unit 150 of the first embodiment, the scanning unit 151 is disposed under the photoresist 121. More specifically, the scanning unit 151 is disposed under the silicon wafer 122 on which the photoresist 121 is deposited. Like the two-dimensional light-modulating fine aperture array apparatus 140 of the first embodiment is infinitesimally moved at a high speed, the silicon wafer 122 is infinitesimally moved at a high speed by the scanning unit 151, so that the predetermined pattern can be transferred at a high speed to the photoresist 121 by using the light passed through the apertures. In the second embodiment, the two-dimensional light-modulating fine aperture array apparatus 140 has only the distance adjusting function.

In the embodiments of the present invention, a liquid crystal light-modulating unit is used as a unit for adjusting the light amount of incident light. However, the ordinarily skilled in the art can easily replace the liquid crystal light-modulating unit with another type of the unit for adjusting the light amount of incident light.

It is obvious to the ordinarily skilled in the art that a DMD (digital micromirror device) such as a TMA (thin film micromirror actuated) may be used as a unit for adjusting the light amount of incident. The DMD comprises a plurality of micromirrors and an actuator for adjusting the light amount of incident light by controlling slant angles of the micromirrors.

In addition, various types of photon/electron optical devices used for the two-dimensional spatial light-modulating unit have been developed. These devices can be employed to implement the present invention.

While the present invention has been particularly shown and described with reference to exemplary embodiments thereof, it will be understood by those skilled in the art that various changes in form and details may be made therein without departing from the spirit and scope of the present invention as defined by the appended claims.

INDUSTRIAL APPLICABILITY

According to the present invention, a scanning process is performed by using a plurality of apertures disposed in a fine interval, so that a fine pattern can be recorded at a speed higher than that of a conventional technique using a single nano probe. In addition, according to the present invention, as the number of apertures in an aperture array is increased, the recording speed is further increased. In a case where the number of apertures is 1,000 or more in each of the x and y directions, the fine pattern can be recorded at 1,000,000 or more times the recording speed in the conventional technique.

In the present invention, in a case where a laser source having a wavelength of a blue or near ultraviolet light is used and sizes of liquid crystal cells and micro lenses are tens of micrometers are used, a nano pattern having a line width of tens of nanometers can be obtained by using even a photoresist used in a conventional semiconductor manufacturing process.

According to the present invention, even in a case where a light having a wavelength of tens of micrometers is passed through an aperture having a diameter of tens of nanometers, the light flux is not reduced, so that a line width of about 30 nm can be obtained. Therefore, the lithography technique according to the present invention will be utilized as an essential technique in the semiconductor industry in at least ten years.

In addition, according to the present invention, it is possible to record a fine pattern with a low price apparatus without using a pattern mask and replacing a high price apparatus.

The invention claimed is:

1. A two-dimensional light-modulating fine aperture array apparatus comprising:
    a spatial light-modulating unit for adjusting quantity of incident light by using a plurality of light quantity adjusting cells arrayed in matrix form;
    a microlens array having microlenses arrayed in matrix form, the microlenses focusing light beams passing through the light quantity adjusting cells;
    a substrate for transmitting the light beams, the substrate attached under the microlens array, the substrate having a thickness equal to a focal length of the microlens; and
    an aperture array having apertures arrayed in matrix form on a thin metal film coated onto the substrate, the apertures transmitting the light beams focused by the microlenses.

2. The two-dimensional light-modulating fine aperture array apparatus according to claim 1, wherein the spatial light-modulating unit is a liquid crystal optical modulator having liquid crystal cells arrayed in matrix form, and wherein the liquid crystal optical modulator adjusts quantity of incident light by controlling alignment of liquid crystal molecules in the liquid crystal cells with a voltage applied thereto.

3. The two-dimensional light-modulating fine aperture array apparatus according to claim 2, wherein the substrate is a glass substrate.

4. The two-dimensional light-modulating fine aperture array apparatus according to claim 2, wherein the substrate is a GaP substrate.

5. The two-dimensional light-modulating fine aperture array apparatus according to claim 1, wherein the spatial light-modulating unit is a digital micromirror device (DMD) having micromirrors arrayed in matrix form, and wherein the digital micromirror device adjusts quantity of incident light by controlling slant angles of the micromirrors.

6. A two-dimensional light-modulating fine aperture array apparatus comprising:
    a spatial light-modulating unit for adjusting quantity of incident light by using a plurality of light amount adjusting cells arrayed in matrix form;
    a microlens array having microlenses arrayed in matrix form, the microlenses focusing light beams passing through the light quantity adjusting cells, a focal point of each microlens is located on a surface of the said each microlens; and
    an aperture array having apertures at the focal points of the microlenses on the thin metal film, the thin metal film being coated on the surfaces of the microlens.

7. The two-dimensional light-modulating fine aperture array apparatus according to claim 6, wherein the spatial light-modulating unit is a liquid crystal optical modulator having liquid crystal cells arrayed in matrix form, and wherein the liquid crystal optical modulator adjusts quantity of incident light by controlling alignment of liquid crystal molecules in the liquid crystal cells with a voltage applied thereto.

8. The two-dimensional light-modulating fine aperture array apparatus according to claim 7, wherein the substrate is a glass substrate.

9. The two-dimensional light-modulating fine aperture array apparatus according to claim 7, wherein the substrate is a GaP substrate.

10. The two-dimensional light-modulating fine aperture array apparatus according to claim 6, wherein the spatial light-modulating unit is a digital micromirror device (DMD) having micromirrors arrayed in matrix form, and wherein the digital micromirror device adjusts quantity of incident light by controlling slant angles of the micromirrors.

11. The two-dimensional light-modulating fine aperture array apparatus according to claim 6, wherein each microlens has a shape of a cone.

12. A system for recording fine pattern on a recording medium in a high speed, comprising:
    a light source unit for emitting a laser beam;
    an optical transmitting member for transmitting the laser beam;
    a collimated-light generating lens for collimating the laser beam transmitted from the optical transmitting member;
    a two-dimensional light-modulating fine aperture array apparatus comprising: a spatial light-modulating unit for adjusting quantity of incident light by using a plurality of light quantity adjusting cells arrayed in matrix form; a microlens array having microlenses arrayed in matrix form, the microlenses focusing light beams passing through the light amount adjusting cells; a substrate for transmitting the light beams, the substrate attached under the microlens array, the substrate having a thickness equal to a focal length of the microlenses; and an aperture array having apertures arrayed in matrix form on a thin metal film coated on the substrate, the apertures transmitting the light beams focused by the microlenses; and
    a scanning unit for providing relative movement in x and y directions between the recording medium and the two-dimensional light-modulating fine aperture array apparatus to perform a scanning process in a predetermined pattern with the apertures of the microlens array.

13. The system for recording fine pattern on a recording medium in a high speed according to claim 12,
    wherein the scanning unit is connected to the two-dimensional light-modulating fine aperture array apparatus, and
    wherein the scanning process is performed by moving the two-dimensional light-modulating fine aperture array apparatus in the x and y directions.

14. The system for recording fine pattern on a recording medium in a high speed according to claim 12,
    wherein the scanning unit is connected to a supporting unit for supporting the recording medium on which a predetermined fine pattern is recorded by the two-dimensional fine aperture array unit, and wherein the scanning process is performed by moving the supporting unit in the x and y directions.

15. The system for recording fine pattern on a recording medium in a high speed according to claim 13, further comprising:

CCD units disposed at both side over the two-dimensional light-modulating fine aperture array apparatus, the CCD units converting light reflected on the apertures in the two-dimensional light-modulating fine aperture array apparatus into electrical signals;

a polarized light divider for separating a polarized light from light incident to the two-dimensional light-modulating fine aperture array apparatus to provide the separated polarized light to one of the CCD units; and a wave plate for preventing changes in a polarized light passed through the two-dimensional light-modulating fine aperture array apparatus and reflected thereafter, the wave plate providing the polarized light to the other CCD unit.

16. The system for recording fine pattern on a recording medium in a high speed according to claim 12, wherein the spatial light-modulating unit is a liquid crystal optical modulator having liquid crystal cells arrayed in matrix form, and wherein the liquid crystal optical modulator adjusts quantity of incident light by controlling alignment of liquid crystal molecules in the liquid crystal cells with a voltage applied thereto.

17. The system for recording fine pattern on a recording medium in a high speed according to claim 12, wherein the spatial light-modulating unit is a digital micromirror device (DMD) having micromirrors arrayed in matrix form, and wherein the digital micromirror device adjusts quantity of incident light by controlling slant angles of the micromirrors.

18. A system for recording fine pattern on a recording medium in a high speed comprising:

a light source unit for emitting a laser beam;

an optical transmitting member for transmitting the laser beam;

a collimated-light generating lens for collimating the laser beam transmitted from the optical transmitting member;

a two-dimensional light-modulating fine aperture array apparatus comprising: a spatial light-modulating unit for adjusting quantity of incident light by using a plurality of light quantity adjusting cells arrayed in matrix form; a microlens array having microlenses arrayed in matrix form, the microlenses focusing light beams passing through the light quantity adjusting cells, a focal point of each of the microlenses is located on a surface of each of the microlenses; and an aperture array having apertures at the focal points of the microlenses on the thin metal film, the thin metal film being coated on the surfaces of the microlenses; and a scanning unit for providing relative movement in x and y directions between the recording medium and the two-dimensional light-modulating fine aperture array apparatus to perform a scanning process in a predetermined pattern with the apertures of the microlens array.

19. The system for recording fine pattern on a recording medium in a high speed according to claim 18, wherein the spatial light-modulating unit is a liquid crystal optical modulator having liquid crystal cells arrayed in matrix form, and wherein the liquid crystal optical modulator adjusts the light quantity of incident light by controlling alignment of liquid crystal molecules in the liquid crystal cells with a voltage applied thereto.

20. The system for recording fine pattern on a recording medium in a high speed according to claim 18, wherein the spatial light-modulating unit is a digital micromirror device (DMD) having micromirrors arrayed in matrix form, and wherein the digital micromirror device adjusts quantity of incident light by controlling slant angles of the micromirrors.

21. The system for recording fine pattern on a recording medium in a high speed according to claim 18, further comprising:

CCD units disposed at both side over the two-dimensional light-modulating fine aperture array apparatus, the CCD units converting light reflected on the apertures in the two-dimensional light-modulating fine aperture array apparatus into electrical signals;

a polarized light divider for separating a polarized light from light incident to the two-dimensional light-modulating fine aperture array apparatus to provide the separated polarized light to one of the CCD units; and a wave plate for preventing changes in a polarized light passed through the two-dimensional light-modulating fine aperture array apparatus and reflected thereafter, the wave plate providing the polarized light to the other CCD unit.

* * * * *